United States Patent
Stamper et al.

(10) Patent No.: US 9,859,382 B2
(45) Date of Patent: Jan. 2, 2018

(54) INTEGRATED CMOS WAFERS

(71) Applicant: GLOBALFOUNDRIES INC., Grand Cayman (KY)

(72) Inventors: Anthony K. Stamper, Burlington, VT (US); Vibhor Jain, Essex Junction, VT (US); Renata A. Camillo-Castillo, Williston, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/959,825

(22) Filed: Dec. 4, 2015

(65) Prior Publication Data

US 2017/0162656 A1    Jun. 8, 2017

(51) Int. Cl.

| | |
|---|---|
| *H01L 29/267* | (2006.01) |
| *H01L 25/00* | (2006.01) |
| *H01L 25/065* | (2006.01) |
| *H01L 29/20* | (2006.01) |
| *H01L 29/161* | (2006.01) |
| *H01L 27/092* | (2006.01) |
| *H01L 29/737* | (2006.01) |

(52) U.S. Cl.
CPC ........ *H01L 29/267* (2013.01); *H01L 25/0652* (2013.01); *H01L 25/50* (2013.01); *H01L 27/092* (2013.01); *H01L 29/161* (2013.01); *H01L 29/20* (2013.01); *H01L 29/737* (2013.01); *H01L 2224/18* (2013.01)

(58) Field of Classification Search
CPC .................................................. H01L 29/267
See application file for complete search history.

(56) References Cited

U.S. PATENT DOCUMENTS

| 6,737,297 B2* | 5/2004 | Pogge | ................ H01L 21/6835 257/E21.705 |
|---|---|---|---|
| 7,098,070 B2 | 8/2006 | Chen et al. | |
| 7,282,390 B2* | 10/2007 | Tan | ..................... H01L 23/3128 257/724 |
| 7,906,842 B2 | 3/2011 | Park | |
| 8,012,592 B2 | 9/2011 | Fitzgerald | |
| 8,120,060 B2 | 2/2012 | Fitzgerald | |
| 8,159,060 B2 | 4/2012 | Barth et al. | |
| 8,835,988 B2 | 9/2014 | Marino et al. | |

(Continued)

OTHER PUBLICATIONS

Lu, D. "Materials for Advanced Packaging" copyright 2009 pp. 24-25.*

(Continued)

*Primary Examiner* — Asok K Sarkar
*Assistant Examiner* — Grant Withers
(74) *Attorney, Agent, or Firm* — David Cain; Andrew M. Calderon; Roberts Mlotkowski Safran Cole & Calderon, P.C.

(57) ABSTRACT

The present disclosure relates to semiconductor structures and, more particularly, to integrated CMOS wafers and methods of manufacture. The structure includes: a chip of a first technology type comprising a trench structure on a front side; a chip of a second technology type positioned within the trench structure and embedded therein with an interlevel dielectric material; and a common wiring layer on the front side connecting to both the chip of the first technology type and the chip of the second technology type.

20 Claims, 8 Drawing Sheets

(56) References Cited

U.S. PATENT DOCUMENTS

| | | | |
|---|---|---|---|
| 8,927,363 B2 | 1/2015 | Cheng et al. | |
| 2006/0125910 A1 | 6/2006 | Shie et al. | |
| 2007/0105335 A1 | 5/2007 | Fitzgerald | |
| 2008/0128882 A1 | 6/2008 | Baek et al. | |
| 2009/0020855 A1 | 1/2009 | Pyeon | |
| 2011/0175215 A1* | 7/2011 | Farooq | H01L 23/481 257/686 |
| 2013/0119491 A1* | 5/2013 | Luce | H01L 21/84 257/416 |
| 2013/0193574 A1 | 8/2013 | Farooq et al. | |
| 2016/0013151 A1* | 1/2016 | Shen | H01L 25/0652 257/686 |

OTHER PUBLICATIONS

Fukushima, T. "Surface Tension-driven Chip Self-Assembly with Load-free hydrogen fluoride-assisted Direct Bonding at Room Temperature for Three-Dimensional Integrated Circuits" App. Phys. Lett. 96 Apr. 15, 2016 pp. 154105-1 through 154105-3.*

Unknown, "Wafer Sawing", Micross Components, http://www.micross.com/process-flow-wafer-sawing.aspx, Retrieved from the Internet on Dec. 4, 2015, 1 page.

* cited by examiner icon CMOS technologies. The active devices 25 can be, e.g., transistors, etc., formed in a conventional manner as described herein. The passive devices can be wiring formed on the substrate 15 by either an additive or subtractive

INTEGRATED CMOS WAFERS

FIELD OF THE INVENTION

The present disclosure relates to semiconductor structures and, more particularly, to integrated CMOS wafers and methods of manufacture.

BACKGROUND

Different technologies offer different benefits such as ease of integration processes and performance benefits. For example, power amplifiers and CMOS switches have improved performance when used in GaAs technologies, compared to Si technologies. Illustratively, GaAs technologies at 2 GHz provide improved power handing compared to SiGe technologies at the same frequency. These power handling improvements can be, e.g., efficiency, gain, linearity and noise. However, SiGe technologies offer better CMOS controller logic integration and lower cost fabrication processing. Moreover, using power amplifiers in Si technologies requires more area, which can exceed 11% of chip space. This takes valuable area which can otherwise be used for inductors, capacitors, pads, and CMOS controller logic.

SUMMARY

In an aspect of the disclosure, a structure includes: a chip of a first technology type comprising a trench structure on a front side; a chip of a second technology type positioned within the trench structure and embedded therein with an interlevel dielectric material; and a common wiring layer on the front side connecting to both the chip of the first technology type and the chip of the second technology type.

In an aspect of the disclosure, a structure includes: an Si based substrate having Si based technologies built on its surface; a trench formed in the Si substrate having an opening of a certain dimensions; a GaAs chip positioned within the trench and attached to a surface of the Si based substrate, the GaAs chip including technologies which are different than the Si based technologies; a dielectric material embedding the GaAs chip within the trench; and a common front side back end of the line wiring connecting to both the Si based technologies and the GaAs technologies.

In an aspect of the disclosure, a method includes: forming a trench in a front side of an Si based substrate comprising technologies of a first type; placing a chip comprising a technology type different than the first type in the trench; embedding the chip of the different technology type in dielectric material; and forming a common back end of the line wiring from the front side, to both the technology of the first type and to the different technology type.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to integrated CMOS wafers and methods of manufacture. More specifically, the present disclosure discloses GaAs chips integrated with SiGe BiCMOS, Si CMOS, Si on insulator (SOI), etc. wafers; SiGe chips integrated with Si CMOS or SOI wafers; etc. In embodiments, the integrated structures can include, for example, power amplifiers and switches (e.g., GaAs technologies) into silicon CMOS technologies.

In more specific embodiments, the methods and structures provided herein include physically embedding and integrating a smaller semiconductor chip of a first technology type (e.g., GaAs) into a trench of a larger semiconductor chip of a second technology type (e.g., SiGe, Si, or SOI). The smaller chip can share the same backend structures, e.g., wiring, as the larger chip. In this way, Si, SiGe, SO I, and GaAs technologies can be combined into a single chip. Advantageously, by implementing the methods disclosed herein, GaAs technologies which have better power amplifier and switching performance than SiGe technologies can be integrated with SiGe technologies which are cheaper and contain denser CMOS logic. Alternatively, GaAs or SiGe chips can be integrated into SOI, etc.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1A:
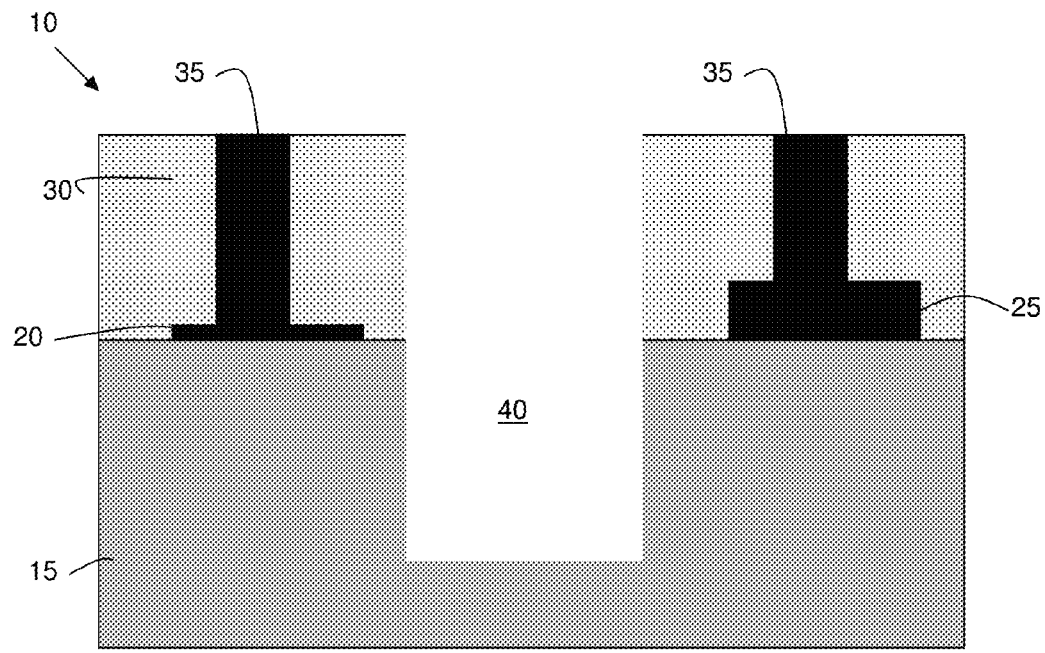
FIGS. 1a and 1b show structures and respective fabrication processing steps in accordance with aspects of the present disclosure.
Figure 1B:
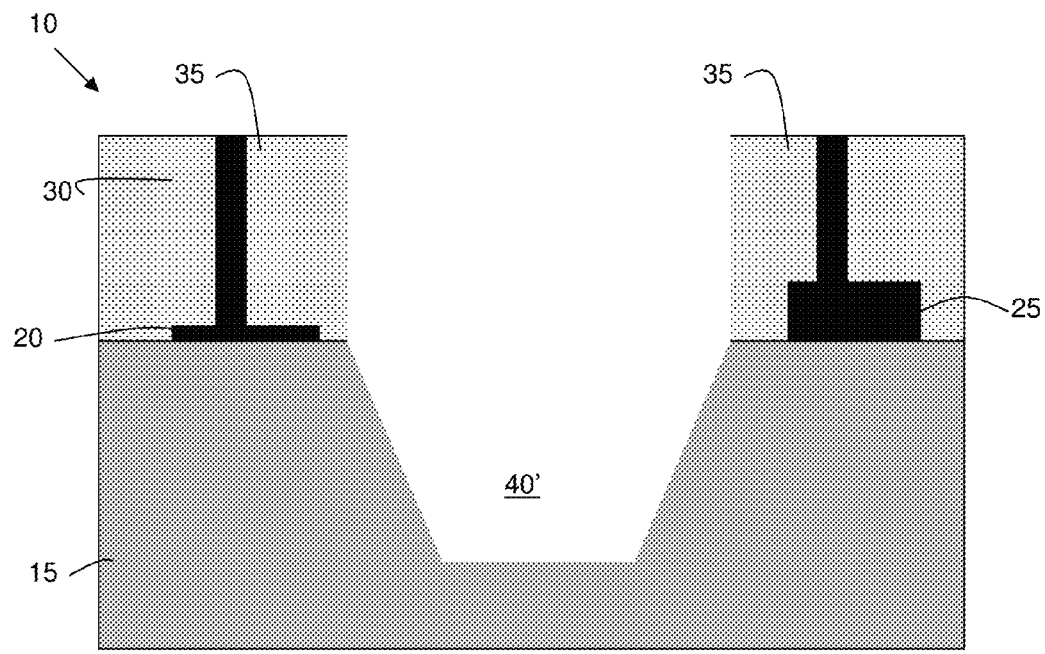

FIGS. 1a and 1b show structures and respective fabrication processing steps in accordance with aspects of the present disclosure. More specifically, FIGS. 1a and 1b show a structure 10 comprising a substrate 15. In embodiments, the substrate 15 can be a BULK wafer of silicon. In embodiments, the substrate can also be, for example, silicon on insulator (SOI), SiGe, SiGeC, SiC or other Si based substrates.

Still referring to FIGS. 1a and 1b, active and passive structures can be formed on the substrate 15 using conventional CMOS technologies. The active devices 25 can be, e.g., transistors, etc., formed in a conventional manner as described herein. The passive devices can be wiring formed on the substrate 15 by either an additive or subtractive metallization process. By way of non-limiting and illustrative example, a metal can be deposited on the substrate 15 using conventional deposition processes, e.g., chemical vapor deposition (CVD), physical vapor deposition (PVD), electroplating (ECP), etc., processes. A resist can be applied over the metal layer, which is then subjected to energy (e.g., light) to form patterns (openings). An etching process, e.g., reactive ion etching (RIE), is then performed through the openings to form the patterned wiring or other passive devices 20. The resist can then be removed using a conventional stripping process, e.g., oxygen ashing.

In embodiments, the wiring can be silicide, as an example, such as cobalt, titanium, platinum, or nickel silicide. As should be understood by those of skill in the art, the silicide process begins with deposition of a thin transition metal layer, e.g., nickel, cobalt, platinum, or titanium, over fully formed and patterned semiconductor devices. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 20 in the active regions of the device.

Following formation of the passive devices 20 and active devices 25, a layer of dielectric material 30 can be deposited on the structure. In embodiments, the dielectric material 30 can be any interlevel dielectric layer such as silicon oxide, FSG, SiCOH, BPSG, PSG, etc., as is known by those of ordinary skill in the art. The dielectric material 30 can be deposited using conventional CVD processes. In embodiments, the passive devices 20 and active devices 25 and subsequent deposition of dielectric material 30 can be formed on one or more wiring levels; although only a single wiring level is shown in FIGS. 1a and 1b for ease of understanding.

FIGS. 1a and 1b further show metal via contacts 35 formed in the dielectric material 30, contacting the passive devices 20 and active devices 25. The metal via contacts 35 can be any appropriate metal or metal alloy, e.g., copper, tungsten, aluminum, etc. The metal via contacts 35 can be formed by conventional lithography, etching and deposition processes, followed by a chemical mechanical polishing (CMP) step to remove any excessive metal from the upper surface of the dielectric material 30. In embodiments, the metal via contacts 35 can be formed at a later stage of fabrication, as described further herein, such as after the chip(s) 45 are placed inside the trench 40 shown in FIG. 2a and the trench 40 is refilled with dielectric and planarized.

As shown in FIG. 1a, a trench 40 is formed on the front side of the chip, in the dielectric material 30 and the substrate 15. In embodiments, the trench 40 is formed in one or more separate etching processes, with selective chemistries to the dielectric material 30 and the substrate 15. In embodiments, the trench 40 can be formed by a SF6-based, CF4-based, or any known dry RIE process as represented in FIG. 1a; although wet etch processes are also contemplated by the present invention as shown in FIG. 1b. By way of example, as shown in FIG. 1b, a wet etch process will result in a V-groove 40' on a front side of the chip using the crystal plane of silicon to enable more precise chip placement (e.g., GaAs chip placement) and height control. In embodiments, the wet etch process can be a TMAH silicon etch with self-alignment to etch edges.

Still referring to FIGS. 1a and 1b, the trench 40, 40' has dimensions which accommodates a chip of a second type of technology, e.g., GaAs, for bonding to the substrate 15. That is, the trench 40, 40' should be larger than the chip, which is to be attached to the substrate 15. The trench 40 or 40' bottom opening needs to be larger than the tie to be mounted chip 45 dimension, taking into account the trench 40 or 40' and chip 45 width and length tolerances. For example, as shown in FIG. 1a, the opening in the substrate 15 can be about 346 µm+/−1 µm wide and 28 µm+/−1 µm deep (e.g., about 27 µm to 29 µm deep); although other dimensions are contemplated by the present invention depending on the size of the chip. In FIG. 1b, the opening in the substrate 15 can also be about 28 µm+/−1 µm deep, but the width will vary due to its V-shape. In embodiments, the V-shape opening (e.g., trench 40') will provide a greater flexibility and tolerance when inserting the chip of a different technology type.

Figure 2A:
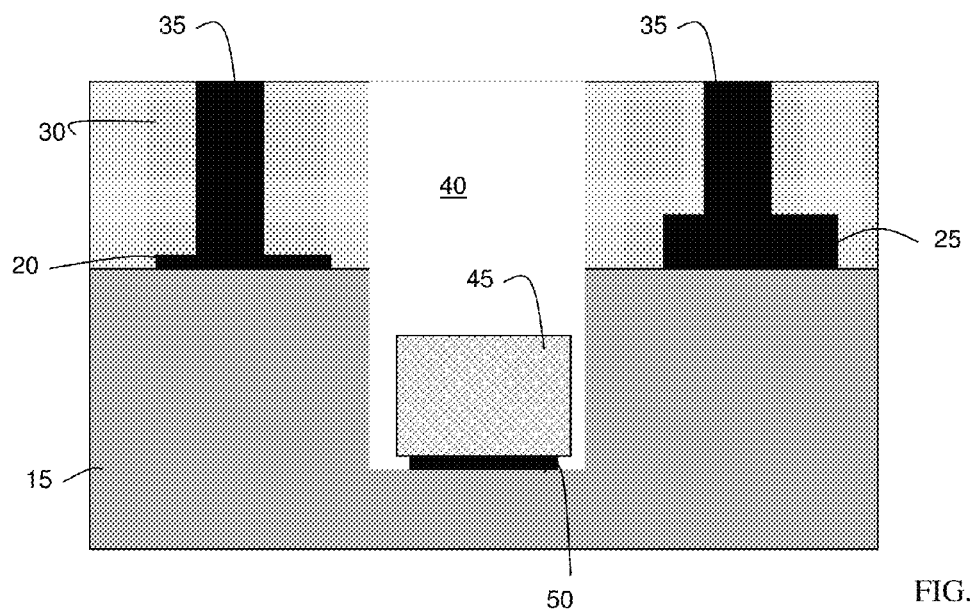
FIGS. 2a and 2b show structures with a chip bonded to a substrate within an opening and respective fabrication processing steps in accordance with aspects of the present disclosure.
Figure 2B:
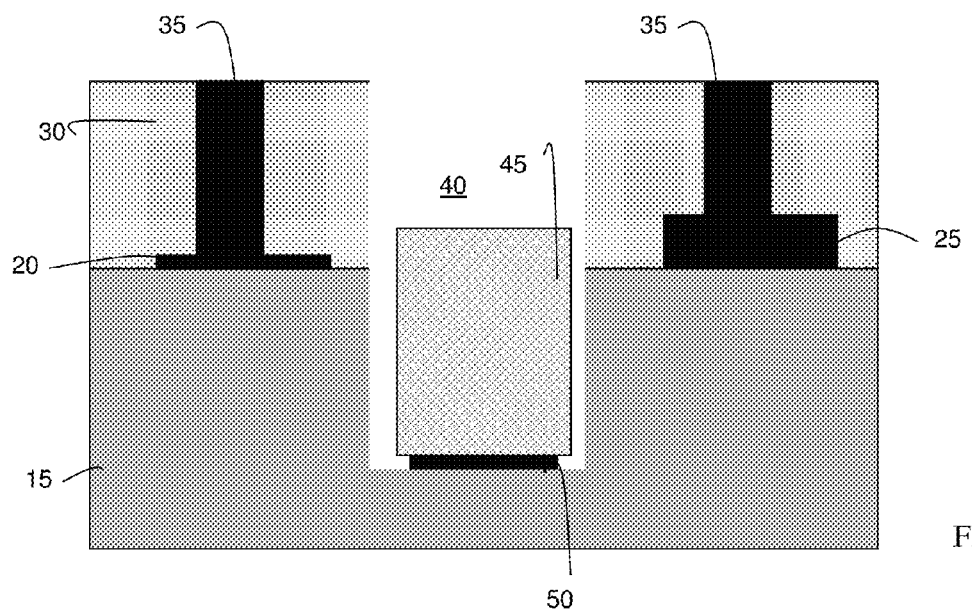

Starting from the structure of FIG. 1a and now referring to FIGS. 2a and 2b, a thinned chip, which may be of different technology type, 45 is placed into the trench 40 and attached to the exposed surface of the substrate 15. In embodiments, the chip 45 can be bonded to the exposed surface of the substrate 15 by any known method such as metal to metal bonding techniques (eutectic bonding), oxide bonding, or using a patterned polyimide bonding, both of which are represented at reference numeral 50. In embodiments, the high temperature polyimide can have a cure temperature of about 350° C. or higher. In yet further alternative embodiments, the bonding 50 can be an adhesive positioned at the bottom of the trench 40 (e.g., opening). In any scenario, the bonding layer thickness will have a small or negligible profile, e.g., less than about 5 µm. The bonding 50 can have a tailored thickness based on the measured, known, or estimated chip 45 thickness to reduce height variability of the chip 45 from, e.g., 3 µm+/−2 µm to 1.0 µm+/−0.3 µm. For example, a 20 µm thick chip 45 could use 5 µm of bonding layer 50 while a 22 µm chip 45 could use 3 µm of bonding layer 50.

In yet further alternative embodiments, the chip 45 can be bonded to the substrate 15 within the trench 40 using a self-aligned process. For example, the bonding 50 can be a self-assembling oxide-oxide bond using water droplets, as known in the art. In this approach, for example, oxide can be placed on a backside of the chip 45, with patterned oxide formed on a surface of the exposed surface of the substrate 15 within the trench 40. With the water droplet method, the chip 45 is placed over the patterned oxide in the trench 40 or 40' and self-aligns to the patterned oxide.

Still referring to FIGS. 2a and 2b, in embodiments, the chip of different technology type 45 is a GaAs HBT power amplifier chip with an NPN formed through any wiring level. i.e., the GaAs HBT could have metal contacts and vias formed over the HBT or simply dielectric that will be subsequently patterned, etched, and metalized. The chip 45 can also have a thin (e.g., >0.5 µm) dielectric layer, such as silicon nitride and silicon oxide, coated on an upper surface. In embodiments, the NPN is preferred to be placed on the first or subsequent wiring level of the chip in order to accommodate for a wide and tall via landing pad. The chip 45 can also be a high voltage GaN chip or GaAs pHEMPT (pseudomorphic high-electron-mobility transistor) switch or any combinations thereof, as examples, or could be a SOI switch, etc. In any scenario, the chip 45 has dimensions which will fit within the opening (e.g., trench 40, 40'), and which will be placed within the trench prior to formation of the upper metal layer (e.g., back end of the line (BEOL) metal layers).

In embodiments, the chip 45 can be about 340 µm+/−2 µm square, thinned to 20 µm+/−1 µm (e.g., chip thickness of about 19 μm to 21 μm), thus fitting within the opening of silicon which can be 346 μm+/−1 μm wide and 28 μm+/−1 μm deep. As further shown in FIG. 2a, the chip 45 can have a chip thickness or height less than the height of the opening (e.g., chip 45 is below a surface of the substrate 15). In FIG. 2a, for example, a space from the top of the chip 45 (e.g., a top surface of oxide coated GaAs chip) to a silicon top surface can be about 1 μm to 5 μm. In alternative embodiments, as shown in FIG. 2b, the chip 45 can have a chip thickness or height greater than the height of the opening (e.g., chip 45 extends above a surface of the substrate 15). In either scenario of FIG. 2a or 2b, it is preferable that the chip 45 (e.g., GaAs chip) be placed in the opening with a tolerance of about +/−1 μm in both the X and Y dimensions. In embodiments, the contact locations of the chip 45 is about +/−3 μm in the X and Y directions with respect to the substrate 15.

Figure 3A:
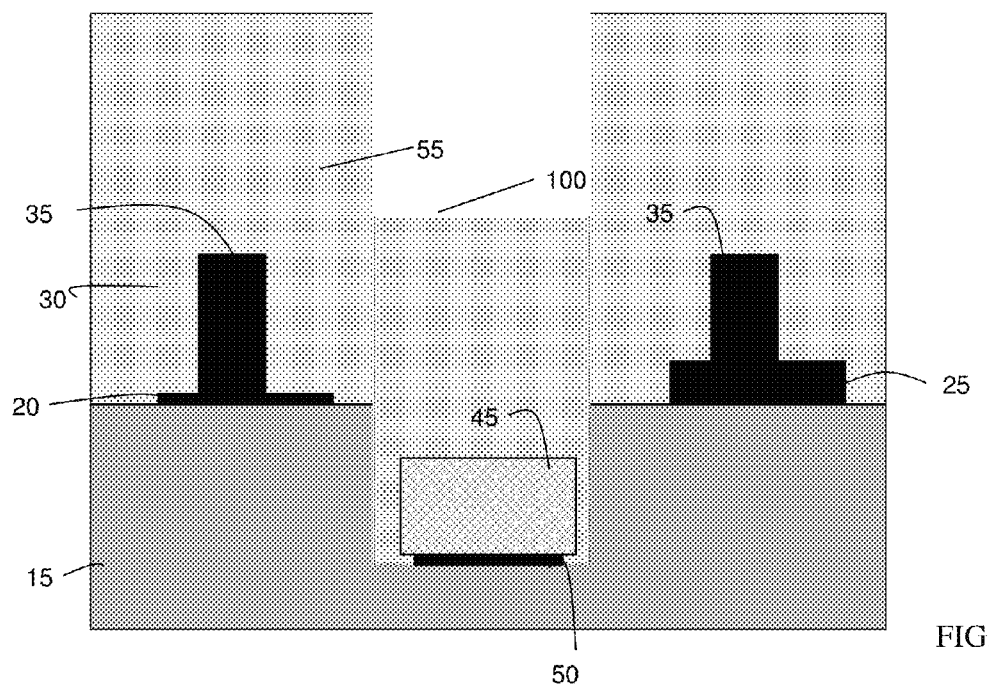
FIGS. 3a-3h show various embodiments of an embedded chip and respective processing steps in accordance with aspects of the disclosure.
Figure 3B:
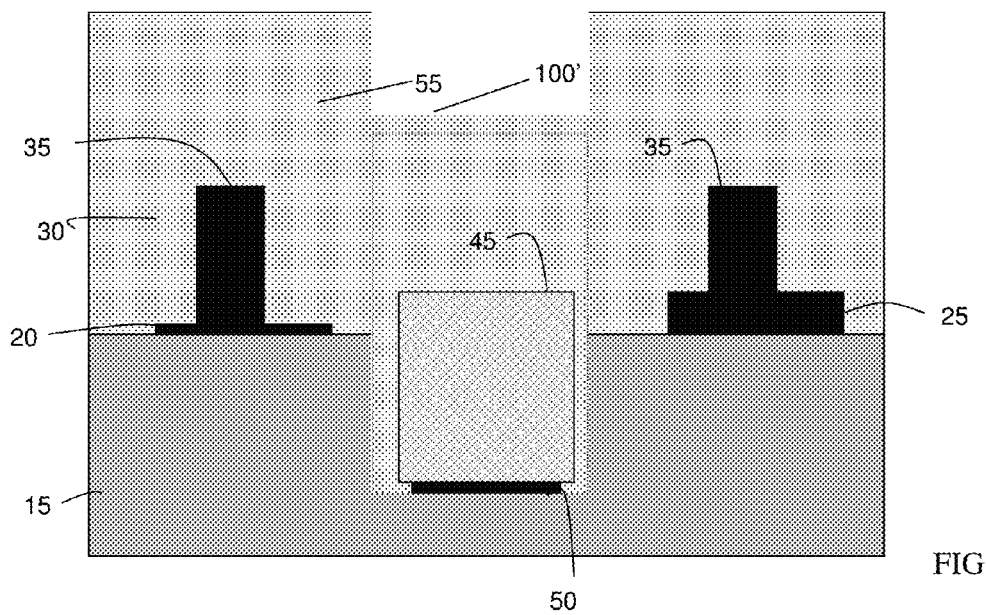

Starting from the structure of FIGS. 2a and 2b and now referring to FIGS. 3a and 3b, a dielectric layer such as an oxide material 55 is deposited on the chip 45 using conventional deposition methods, e.g., CVD processes. In embodiments, the oxide material 55 will embed the chip 45 within the trench 40 (or trench 40' of FIG. 1b). The deposition of the oxide material 55 can be tailored based on the measured height of the chip 45 within the trench 40/40'. For the option where the oxide material 55 thickness is tailored, prior to the deposition of the oxide material 55, a measurement from the surface of the chip 45 to the height of the contact 35 is taken, and this measurement is used to tune the oxide deposition process. If chip 45 is below the substrate 15 top surface (FIGS. 2a and 3a), then more oxide thickness is required so that the oxide can be planarized. Alternatively, if the chip 45 is above the substrate 15 top surface (FIGS. 2b and 3b), then less oxide thickness is required. The height of the oxide material 55 can vary depending on the height of the chip, as shown by reference numeral 100, 100' respective, in FIGS. 3a and 3b.

Figure 3C:
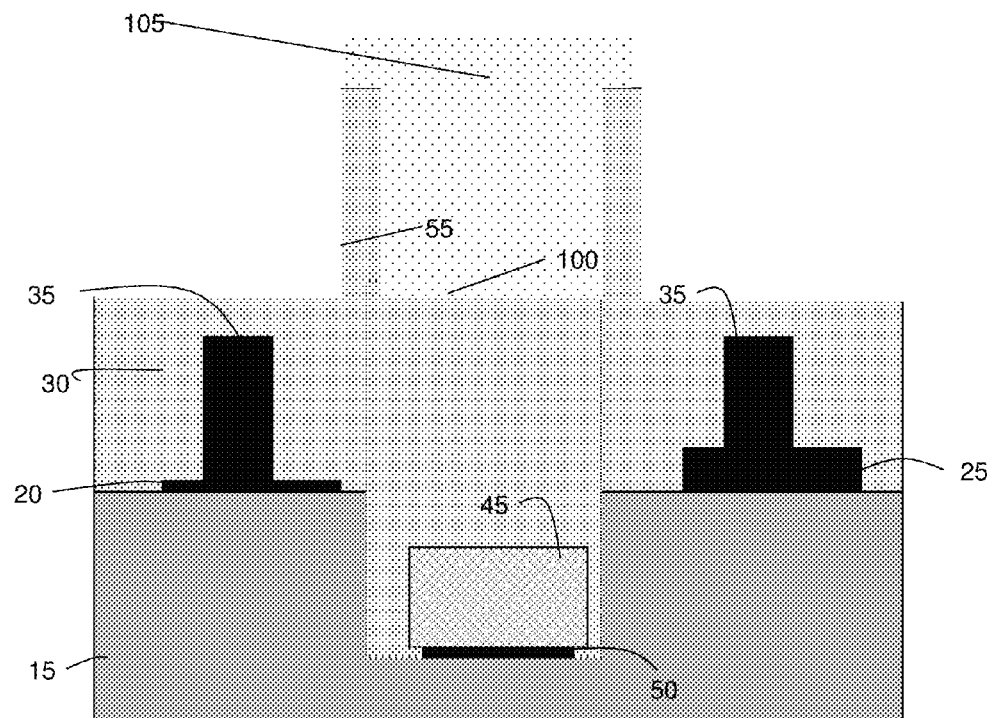
Figure 3D:
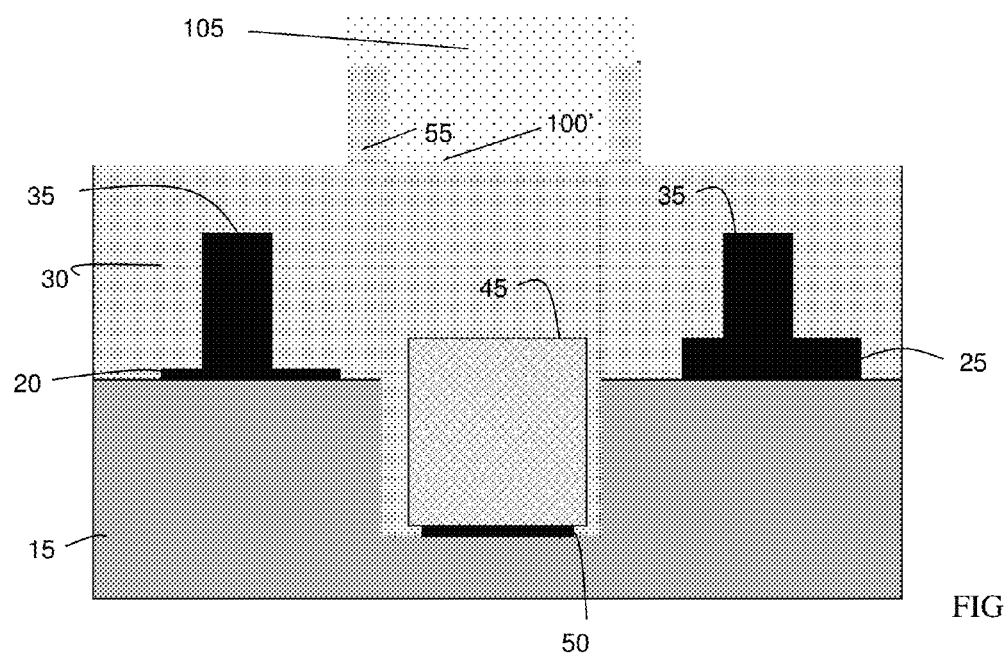
Figure 3E:
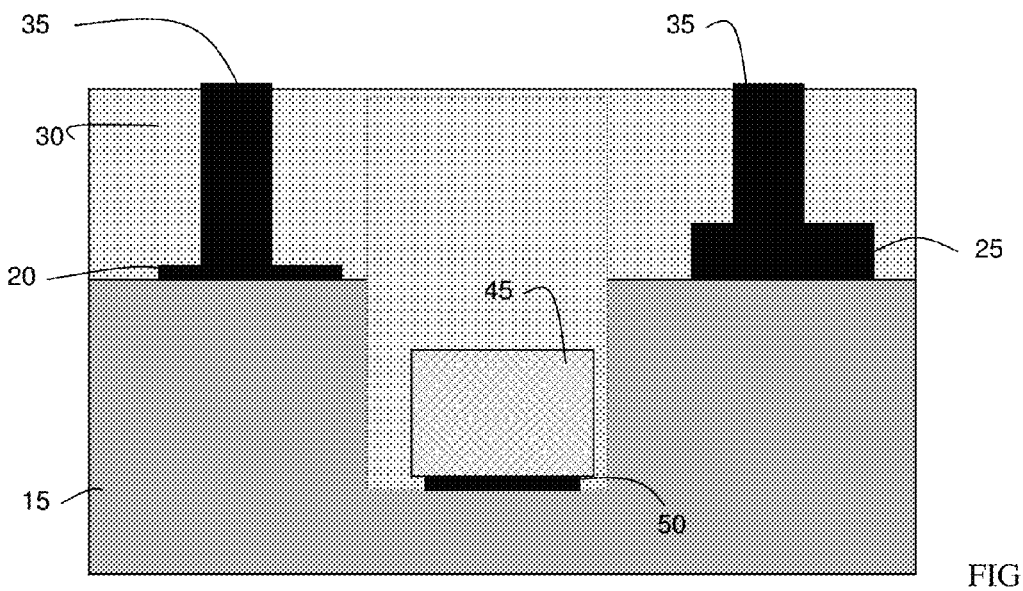
Figure 3F:
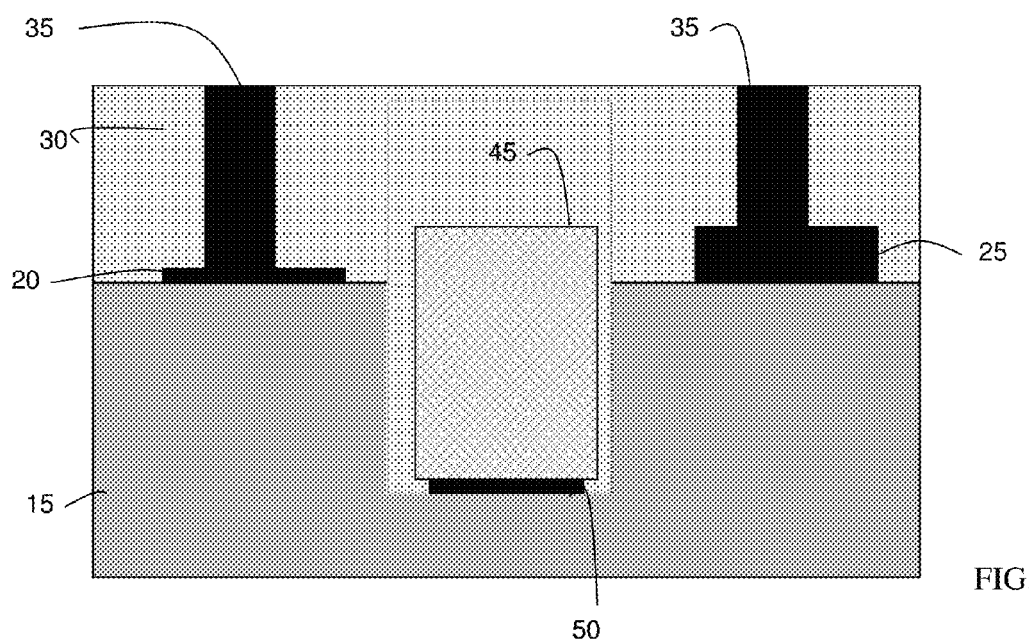
Figure 3G:
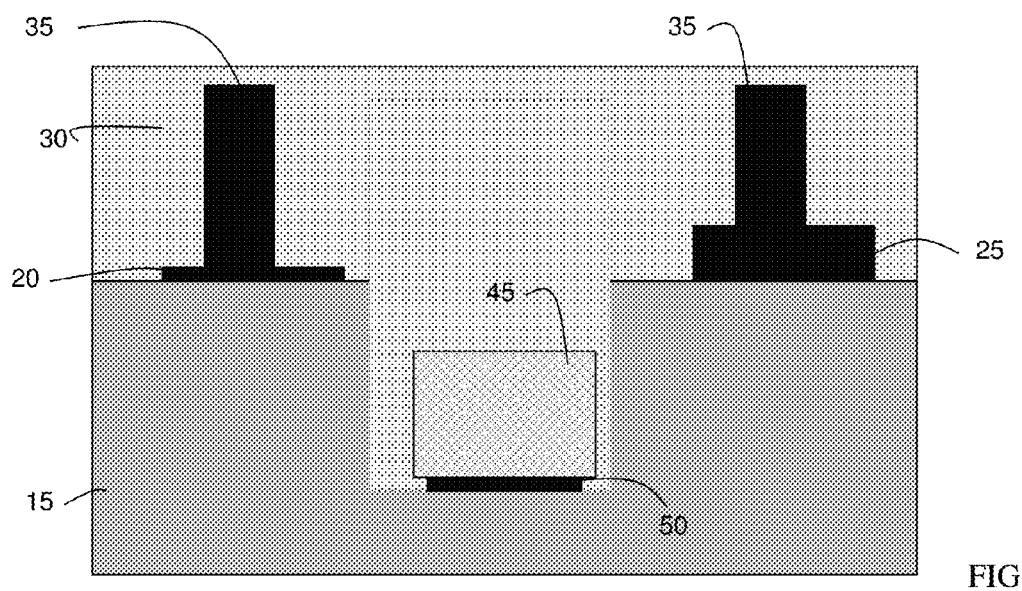
Figure 3H:
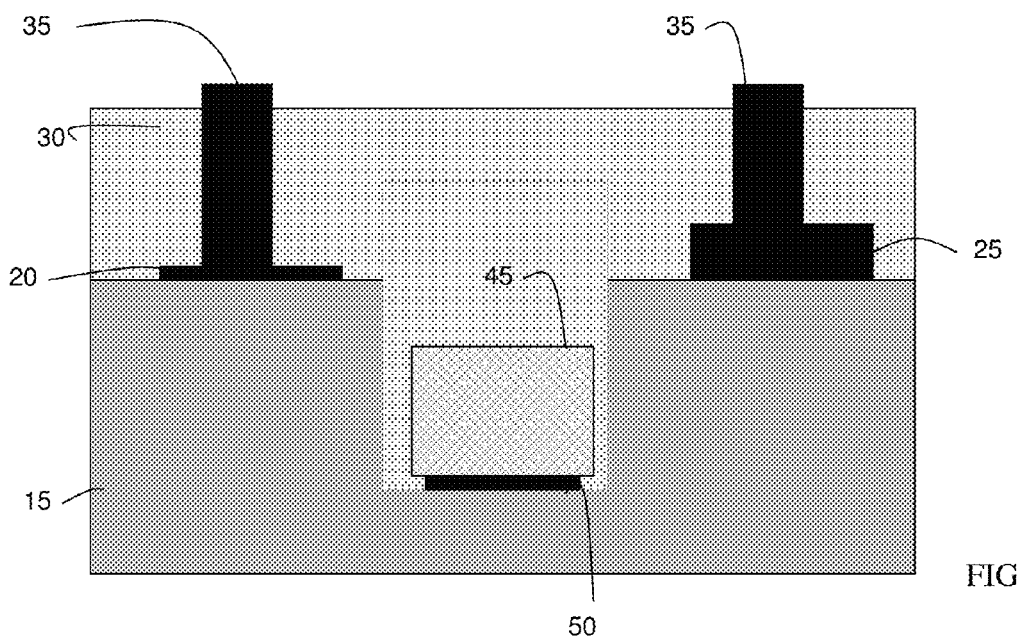

In FIGS. 3c and 3d, the oxide material 30, 55 is reverse masked patterned using photoresist layer 105, etched and planarized. For example, in embodiments, the oxide material 55 undergoes a reverse mask planarization process with a tailored RIE depth, followed by a polishing process (e.g., CMP). The RIE depth can be tailored to the amount needed to reach the 100/100' surface. FIG. 3c shows a deeper RIE depth, because the chip 45 was recessed below the substrate 15 surface; whereas, FIG. 3d shows a shallower RIE depth, because the chip 45 was protruding above the substrate 15 surface. These oxide material 55 and RIE depth tailoring are optional. In a simpler embodiment, the oxide material 55 thickness and RIE depth are set to fixed values to account the variability in chip surface 45 with respect to the substrate 15 top surface. After the RIE step, the photoresist would be stripped, followed by a chemical mechanical polish (CMP) step to planarize the wafer surface, as shown in FIGS. 3e and 3f. In embodiments, the polishing process will leave oxide material 30 above (FIG. 3g) or below (FIG. 3h) a top surface of the metal via contacts 35. In embodiments, the height of the metal via contacts 35 can also be adjusted based on a worst case tolerance for the oxide material 30, 55.

Figure 4:
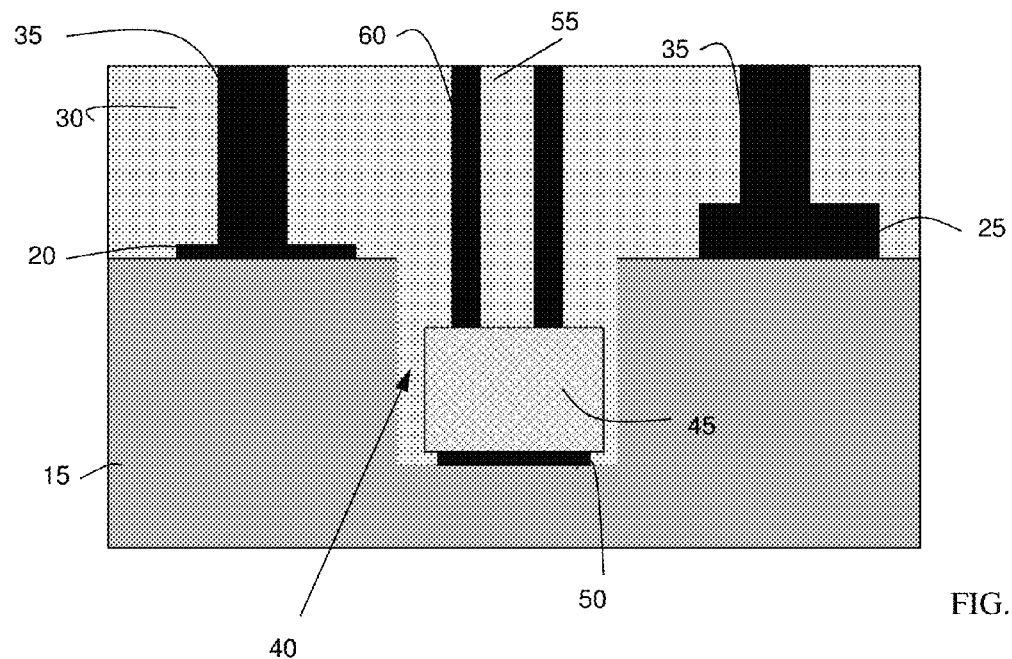
FIG. 4 shows recessed and planarized material over the embedded chip and respective processing steps in accordance with aspects of the disclosure.

In FIG. 4, contacts 60 to chip 45 are formed by patterning, etching, metalizing, and polishing as is known to those of ordinary skill in the art. As with contacts 35, W, Cu, or any known metallization process could be used. It should be understood that the contacts 60 are not drawn to scale. In embodiments, the contacts 60 could be wider, taller, and/or shorter than contacts 35 because of the X-Y alignment and height variability of chip 45 with respect to contacts 35. In FIG. 4, the depth of the remaining oxide 55 over the embedded chip 45 can be measured prior to the patterning, etching and deposition process which are used to fabricate stud contacts 60. The measurements can be used to account for variable oxide thickness over the embedded chip 45 such that the RIE depth of contact 60 is adjusted based on the measured dielectric layer 55 thickness over chip 45. After such measurements, patterning, etching and deposition of stud contacts 60 can be performed.

More specifically, the stud contacts 60 are formed by depositing a resist over the oxide material 55 and exposing the resist to energy (e.g., light) to form a pattern (openings). An etching process, e.g., RIE, is performed through the openings to form vias, exposing the top surface of the embedded chip 45. In embodiments, the vias can be about 1.0 μm wide and about 1.5 μm to about 5.5 μm tall, depending on the height of the oxide material 55 over the embedded chip 45. In embodiments, the vias will land fully on the embedded chip, which can have pads of approximately 7 μm wide to take into account the X-Y variability of chip 45 with respect to contacts 35. The width of the landing pads will ensure a proper alignment with the subsequently formed stud contacts 60. Said more succinctly, the contact pads of the embedded chip 45 are large enough to account for predetermined X and Y overlay tolerance due to both random chip X and Y location in the trench 40 (or trench 40' of FIG. 1b).

Still referring to FIG. 4, the resist can be removed using conventional processes as described herein. A metal material is deposited within the vias, contacting the exposed portions of the embedded chip 45. In embodiments, the metal material can be deposited using conventional deposition methods, followed by a CMP process to remove any excess metal residue from the top surface of the oxide material 30, 55. The metal material can be, e.g., tungsten, etc. In this way, stud contacts 60 are fully landed and formed on the embedded chip 45. Also, as should now be understood by those of ordinary skill in the art, the stud contacts 60 can have variable height determined by the thickness of the chip 45, depth in the trench 40, and planarized oxide thickness over the chip 45. In embodiments, the contacts 35 can also be formed in the same processing steps as the stud contacts 60.

Figure 5:
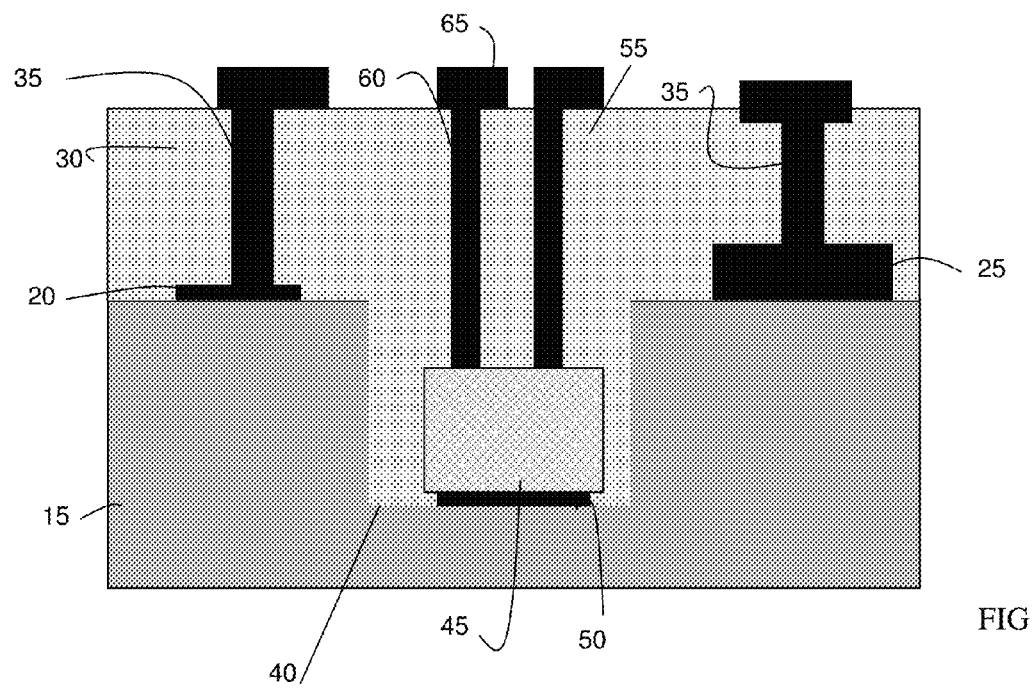
FIG. 5 shows contact formation to the embedded chip and respective processing steps in accordance with aspects of the disclosure.

FIG. 5 shows standard back end of the line (BEOL) metal layers 65 being formed in contact with the stud contacts 60 and contacts 35. In this way, one or more common wiring and via layers can be formed simultaneously for two different technologies, saving consideration fabrication costs.

Figure 6:
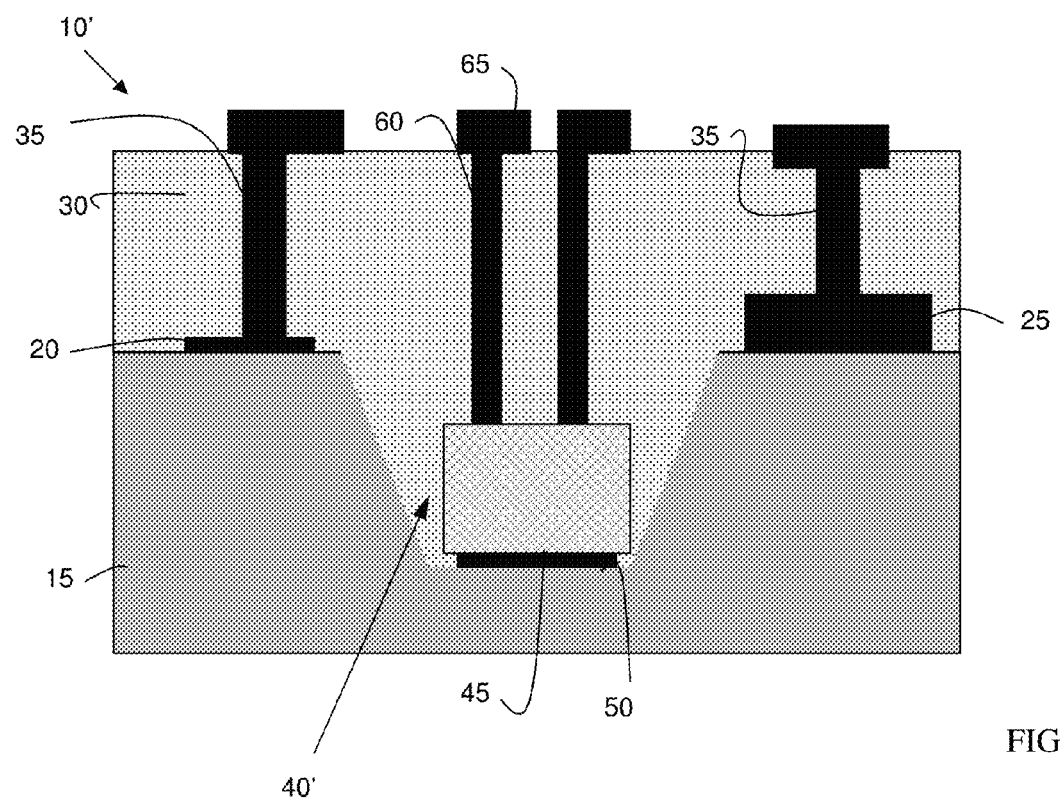
FIG. 6 shows an alternative structure and respective processing steps in accordance with aspects of the disclosure.

FIG. 6 shows a structure with the chip 45 embedded within the V-groove trench 40' (originally described in FIG. 1b). In this structure 10' and fabrication processes, the chip 45 can have improved chip placement and height control. In embodiments, the V-groove trench 40' can have a self-alignment to about +/−0.5 μm.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
 a chip of a first semiconductor material comprising a trench structure on a front side;
 a chip of a second semiconductor material positioned within the trench structure and embedded therein with an interlevel dielectric material; and
 a common wiring layer on the front side connecting to both the chip of the first semiconductor material and the chip of the second semiconductor material,
 wherein the chip of the first semiconductor material comprises Si based technologies and the chip of the second semiconductor material comprises GaAs based technologies.

2. The structure of claim 1, wherein the chip of the second semiconductor material is attached to the chip of the first semiconductor material within the trench structure.

3. The structure of claim 2, wherein the attachment is an adhesive.

4. The structure of claim 2, wherein the attachment is a metal to metal bond.

5. The structure of claim 2, wherein the attachment is a patterned and cured polyimide bond.

6. The structure of claim 2, wherein the attachment is a self-assembling oxide-oxide bond using water droplets.

7. The structure of claim 1, wherein the GaAs based technologies include a power amplifier.

8. The structure of claim 1, wherein the GaAs based technologies include switches.

9. A structure, comprising:
 a chip of a first semiconductor material comprising a trench structure on a front side;
 a chip of a second semiconductor material positioned within the trench structure and embedded therein with an interlevel dielectric material; and
 a common wiring layer on the front side electrically connecting to both the chip of the first semiconductor material and the chip of the second semiconductor material,
 wherein the trench structure is a V-shaped opening provided in a substrate of the chip of the first semiconductor material.

10. The structure of claim 9, wherein the chip of the first semiconductor material comprises Si based technologies and the chip of the second semiconductor material comprises Ga based technologies or an SOI switch.

11. A structure, comprising:
 a Si based substrate having Si based technologies built on its surface;
 a trench formed in the Si substrate having an opening of a certain dimensions;
 a GaAs chip positioned within the trench and attached to a surface of the Si based substrate, the GaAs chip including technologies which are different than the Si based technologies;
 a dielectric material embedding the GaAs chip within the trench; and
 a common front side back end of the line wiring connecting to both the Si based technologies and the GaAs technologies.

12. The structure of claim 11, wherein the GaAs technologies include at least one of power amplifiers and switches.

13. The structure of claim 11, wherein the attachment of the GaAs chip to the surface of the Si based substrate within the trench is an adhesive.

14. The structure of claim 11, wherein the attachment of the GaAs chip to the surface of the Si based substrate within the trench is a metal to metal bond.

15. The structure of claim 11, wherein the attachment of the GaAs chip to the surface of the Si based substrate within the trench is a patterned and cured polyimide bond.

16. The structure of claim 11, wherein the trench structure is a V-shaped trench.

17. A method comprising:
 forming a trench in a front side of an Si based substrate;
 placing a chip comprising GaAs based technologies in the trench;
 embedding the chip of the GaAs based technologies in dielectric material; and
 forming a common back end of the line wiring from the front side, to both the Si based substrate and to the chip of the GaAs based technologies.

18. The method of claim 17, wherein the trench structure is a V shaped trench formed by a wet etching process.

19. The method of claim 17, wherein contacts formed to the chip of the GaAs based technologies and the Si based substrate are formed in same fabrication processes.

20. The method of claim 17, further comprising:
 tuning a deposition process of the dielectric material by measuring from a top surface of the chip of the GaAs based technologies; and
 performing a reverse mask planarization process to remove portions of the dielectric material over the chip of the GaAs based technologies and to expose a top portion of contacts formed to the Si based substrate.

* * * * *